United States Patent
Afghahi

(10) Patent No.: US 6,995,620 B2
(45) Date of Patent: *Feb. 7, 2006

(54) OSCILLATOR HAVING MULTI-PHASE COMPLEMENTARY OUTPUTS

(75) Inventor: Morteza Cyrus Afghahi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/050,120

(22) Filed: Feb. 3, 2005

(65) Prior Publication Data

US 2005/0128824 A1    Jun. 16, 2005

Related U.S. Application Data

(63) Continuation of application No. 10/355,756, filed on Jan. 31, 2003, now Pat. No. 6,870,431, which is a continuation of application No. 09/735,327, filed on Dec. 12, 2000, now Pat. No. 6,566,968.

(60) Provisional application No. 60/170,590, filed on Dec. 13, 1999.

(51) Int. Cl.
*H03B 27/00*    (2006.01)

(52) U.S. Cl. .......................... 331/46; 331/45; 331/50; 331/57

(58) Field of Classification Search ................. 331/57, 331/45, 46, 50
See application file for complete search history.

(56) References Cited

U.S. PATENT DOCUMENTS

| | | | |
|---|---|---|---|
| 4,914,318 A | 4/1990 | Allen | |
| 5,053,652 A | 10/1991 | Sato et al. | |
| 5,635,877 A | 6/1997 | Monk et al. | |
| 5,677,650 A | 10/1997 | Kwasniewski et al. | |
| 5,731,734 A | 3/1998 | Pathak et al. | |
| 6,025,756 A | 2/2000 | Miyabe | |
| 6,566,968 B2 | 5/2003 | Afghahi | |
| 6,617,936 B2 | 9/2003 | Dally et al. | |
| 6,870,431 B2 * | 3/2005 | Afghahi | 331/46 |

OTHER PUBLICATIONS

PCT International Search Report dated Oct. 16, 2001 for corresponding PCT Application No. PCT/US00/42762 filed Dec. 12, 2000.

Kumar, V., "Digital Technology Principles and Practice," John Wiley & Sons. 1995, pp. 626-629.

* cited by examiner

*Primary Examiner*—Arnold Kinkead
(74) *Attorney, Agent, or Firm*—Christie, Parker & Hale, LLP

(57) ABSTRACT

An oscillator having multi-phase complementary outputs comprises a first plurality of single ended amplifiers connected in series to form an input and an output and a second plurality of single ended amplifiers connected in series to form an input and an output. The first and second plurality have the same odd number of amplifiers, A first feedback path connects the output to the input of the first plurality of amplifiers to establish oscillations in the first plurality of amplifiers at a frequency dependent upon the delay time from the input to the output of the first plurality. A second feedback path connects the output to the input of the second plurality of amplifiers to establish oscillations in the second plurality of amplifiers at a frequency dependent upon the delay time from the input to the output of the second plurality. A first locking circuit is connected between comparable first points in the first and second plurality of amplifiers to ensure that the first points are oscillating in complementary fashion and a second locking circuit is connected between comparable second points in the first and second plurality of amplifiers to ensure that the second points are oscillating in complementary fashion.

1 Claim, 2 Drawing Sheets

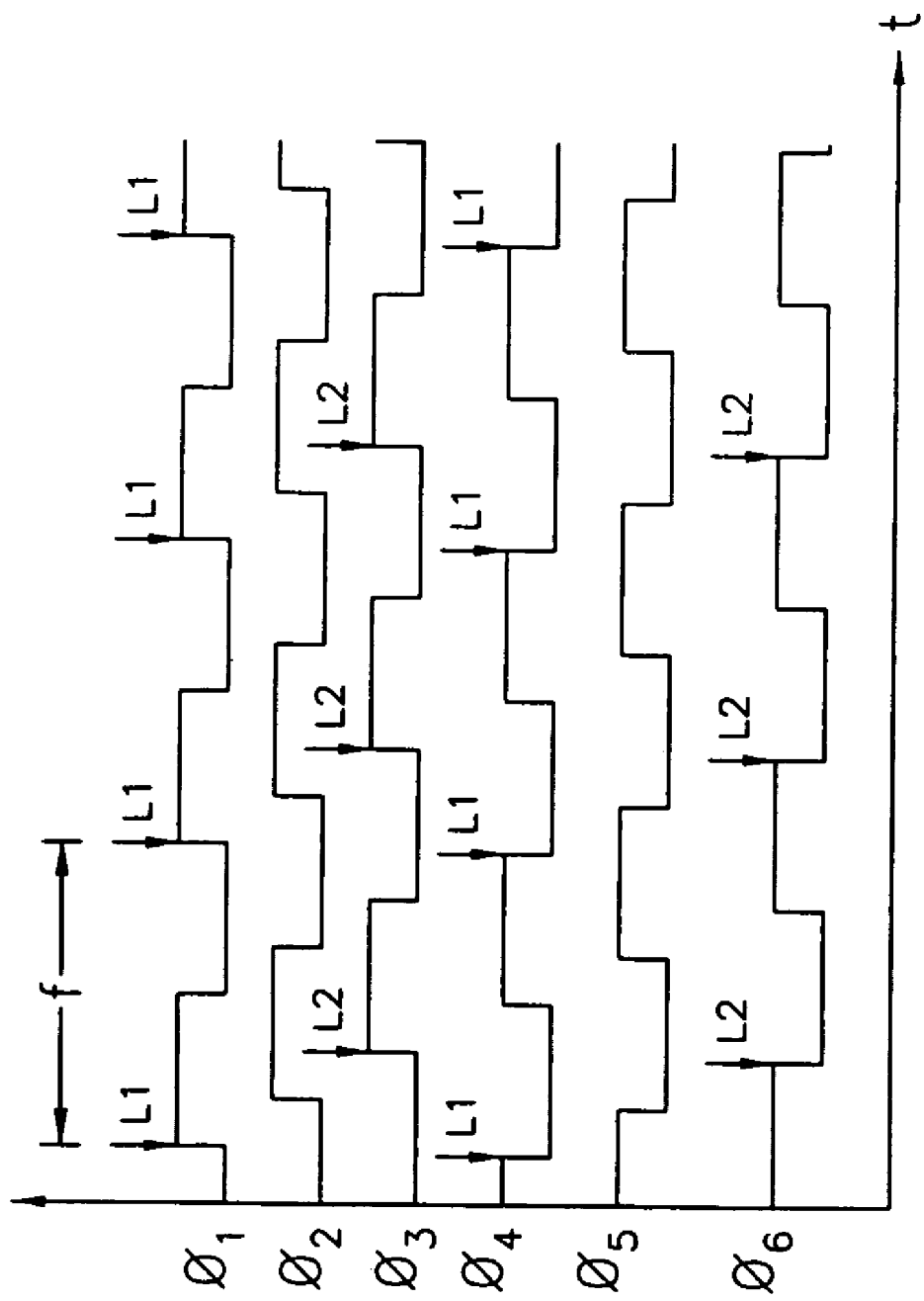

OSCILLATOR HAVING MULTI-PHASE COMPLEMENTARY OUTPUTS

CROSS-REFERENCE TO RELATED APPLICATIONS

This application is a continuation of application Ser. No. 10/355,756 filed Jan. 31, 2003 (now U.S. Pat. No. 6,870,431), which is a continuation of application Ser. No. 09/735,327 filed Dec. 12, 2000 (now U.S. Pat. No. 6,566,968), which claims the benefit of U.S. Provisional Application No. 60/170,590 filed Dec. 13, 1999, the disclosures of which are incorporated fully herein by reference.

BACKGROUND OF THE INVENTION

This invention relates to high frequency oscillators, and more particularly, to a high frequency oscillator having complementary multi-phase outputs.

In the data communications field, there are many applications for a multi-phase oscillator with complementary outputs. For example, a nine stage oscillator would produce at the oscillator frequency nine six multi-phase output signals phased 40, 80, 120, 160, 200, 240, 280, 320, and 360 degrees from each other. But each stage adds delay. Thus, generally the more stages there are, the slower is the oscillator and the lower is the maximum frequency of the oscillator. Complementary outputs can be generated by using differential stages or inverting single-ended outputs. However, both of these measures slow the oscillator operation and load the circuitry.

SUMMARY OF THE INVENTION

According to the invention, an oscillator having multi-phase complementary outputs comprises a first plurality of single ended bistable amplifiers connected in series to form an input and an output and a second plurality of single ended bistable amplifiers connected in series to form an input and an output. The first and second plurality have the same odd number of amplifiers, A first feedback path connects the output to the input of the first plurality of amplifiers to establish bistable oscillations in the first plurality of amplifiers at a frequency dependent upon the delay time from the input to the output of the first plurality. A second feedback path connects the output to the input of the second plurality of amplifiers to establish bistable oscillations in the second plurality of amplifiers at a frequency dependent upon the delay time from the input to the output of the second plurality. A first locking circuit is connected between comparable first points in the first and second plurality of amplifiers to ensure that the first points are oscillating in complementary fashion and a second locking circuit is connected between comparable second points in the first and second plurality of amplifiers to ensure that the second points are oscillating in complementary fashion.

BRIEF DESCRIPTION OF THE DRAWINGS

The features of specific embodiments of the best mode contemplated of carrying out the invention are illustrated in the drawings, in which:

FIG. 2 are waveforms illustrating the multi-phase complementary outputs generated by the oscillator of FIG. 1.

DETAILED DESCRIPTION OF THE EMBODIMENT

Figure 1:
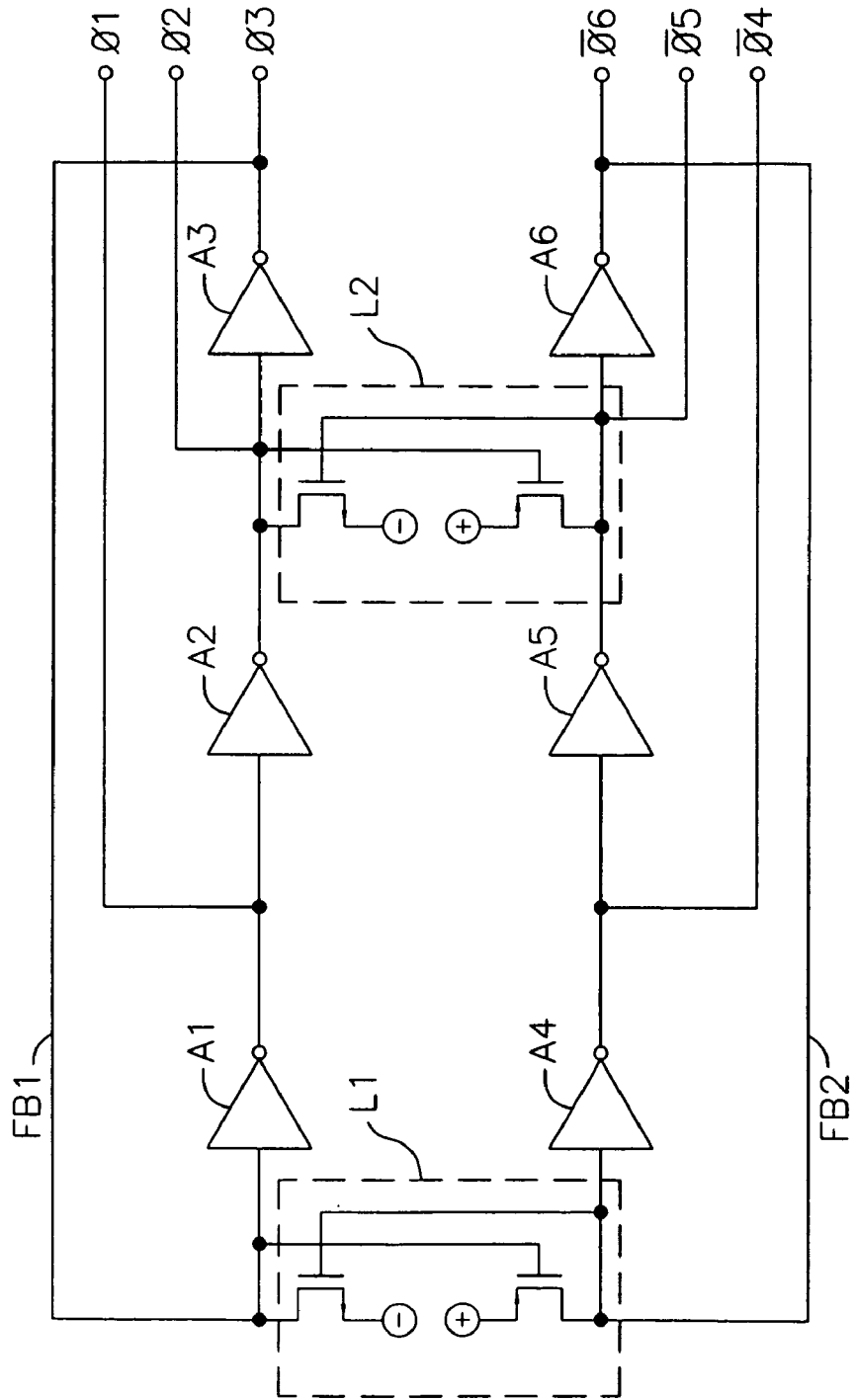
FIG. 1 is a schematic block diagram of an oscillator illustrating the principles of the invention.

In FIG. 1 a first plurality of single-ended inverting amplifiers A1, A2, A3 are connected in series in the order recited and a second plurality of single-ended inverting amplifiers A4, A5, A6 are connected in series in the order recited. Amplifiers A1 to A6 are biased to operate in a bistable mode such that the output of an amplifier is high when the input thereto is low, and visa versa. A feedback path FB1 connects the output of amplifier A3 to the input of amplifier A1 to establish bistable oscillations in amplifiers A1, A2, A3 at a frequency dependent upon the delay time from the input of amplifier A1 to the output of amplifier A3. Similarly, a feedback path FB2 connects the output of amplifier A4 to the input of amplifier A6 to establish bistable oscillations in amplifiers A4, A5, A6 at a frequency dependent upon the delay time from the input of amplifier A4 to the output of amplifier A6. In summary, amplifiers A1, A2, and A3 together with feedback path FB 1 form a first ring oscillator, and amplifiers A4, A5, and A6 together with feedback path FB 2 form a second ring oscillator. Amplifiers A1, A2, and A3 are connected to output terminals ø1, ø2, and ø3, respectively, where multi-phase bistable clock signals appear at 120 degree intervals. Similarly, amplifiers A4, A5, and A6 are connected to output terminals ø4, ø5, and ø6, respectively, where multi-phase bistable clock signals also appear at 120 degree intervals.

A locking circuit L1 is connected between one point of the first ring oscillator, namely the input of amplifier A1 and the comparable point of the second ring oscillator, namely the input of amplifier A4. Similarly, a locking circuit L2 is connected between one point of the first ring oscillator, namely the input of amplifier A3 and the comparable point of the second ring oscillator, namely the input of amplifier A6. Optionally, another locking circuit could be connected between the inputs of amplifiers A2 and A5 or locking circuit L1 could be connected between amplifiers A2 and A5 instead of between A3 and A6. Locking circuits L1 and L2 each preferably comprise a latch in the form of a pair of complementary cross-coupled CMOS transistor stages. For example, as shown in FIG. 1, the drain of an n-type transistor stage is connected to the input of amplifier A1, its source is connected to a supply of negative bias potential, and its gate is connected to the input of amplifier A4. Similarly, the drain of a p-type transistor stage is connected to the input of amplifier A4, its source is connected to a supply of positive bias potential, and its gate is connected to the input of amplifier A1. Since the complementary transistor stages are cross-coupled, the inputs to amplifiers A1 and A4 are forced into complementary states. When the signal at the input of amplifier A1 starts to go negative, the p-type transistor stage starts to conduct, which applies a positive potential to the input of amplifier A4 and the gate of the n-type transistor stage. As a result, a larger negative potential is applied to the input of amplifier A1 and a larger positive potential is applied to the input of amplifier A4 until amplifier A1 reaches one bistable state and amplifier A4 reaches the opposite bistable state. Similarly, when the signal at the input of amplifier A4 starts to go positive, the n-type transistor stage starts to conduct, which applies a negative potential to the input of amplifier A1 and the gate of the p-type transistor stage. As a result, a larger positive potential is applied to the input of amplifier A1 and a larger negative potential is applied to the input of amplifier A1 until amplifier A1 reaches the other bistable state and amplifier A4 reaches the opposite bistable state. Thus, locking circuits L1 and L2 synchronize the operation of the first and second ring oscillators in frequency and phase such that the multi-phase outputs of the second ring oscillator are complementary to the multi-phase outputs of the first ring oscillator, i.e., that the clock signals appearing at output terminals ø4, ø5, and ø6 are complementary to the clock signals appearing at output terminals ø1, ø2, and ø3, respectively.

As shown, both transistors stages of locking circuit L1 turn on and off at the same time. The same is true for locking circuit L2.

The relationship between the multi-phase outputs of the first and second ring oscillators is illustrated in FIG. 2, in which the vertical axis designates the bistable clock signals at the output terminals and the horizontal axis designates elapsed time. Note that the frequency f of the clock signals is the same, the phase interval between the clock signals at output terminals ø1, ø2, and ø3 is 120 degrees, the phase interval between the clock signals at output terminals ø4, ø5, and ø6 is 120 degrees, and the clock signals at output terminals ø1, ø2, and ø3 are complementary to the clock signals at output terminals ø4, ø5, and ø6. Note also the arrows marked "L1", which represents the action of latch L1 forcing amplifiers A1 and A4 into complementary relationship and the arrows marked "L2", which represents the action of latch L2 forcing amplifiers A3 and A6 into complementary relationship.

The described embodiment of the invention is only considered to be preferred and illustrative of the inventive concept; the scope of the invention is not to be restricted to such embodiment. Various and numerous other arrangements may be devised by one skilled in the art without departing from the spirit and scope of this invention. For example, more or fewer amplifiers could be used in each ring oscillator, depending on the number of phases required for the application at hand. If inverting amplifiers are employed, however, an odd number of amplifiers is preferred to provide a phase inversion from output to input of the ring oscillator without a separate inverter stage. If speed is a consideration, the number of amplifiers should be minimized, preferably three in number, unless more phases are required.

What is claimed is:

1. A method for synchronizing two complementary parallel circuits comprising:
   connecting a first plurality of bistable stages in a tandem arrangement;
   connecting a second plurality of bistable stages in a tandem arrangement that operates in complementary fashion to the first plurality;
   cross-coupling a pair of complementary transistors to the same point in each tandem arrangement; and
   biasing the complementary transistors with potentials of opposite polarity so the pair of complementary transistors turn on and off together.

* * * * *